United States Patent [19]

Mosier

[11] Patent Number: 4,740,690
[45] Date of Patent: Apr. 26, 1988

[54] ABSOLUTE COMBINATIONAL ENCODERS COUPLED THROUGH A FIXED GEAR RATIO

[75] Inventor: Donald E. Mosier, Hiawatha, Iowa

[73] Assignee: Rockwell International Corporation, El Segundo, Calif.

[21] Appl. No.: 414,164

[22] Filed: Sep. 2, 1982

[51] Int. Cl.⁴ .............................................. G01D 5/34
[52] U.S. Cl. ............................ 250/231 SE; 340/347 P
[58] Field of Search .............. 250/231 SE; 340/347 P; 324/175

[56] References Cited

U.S. PATENT DOCUMENTS

| | | | |
|---|---|---|---|
| 3,714,448 | 1/1973 | Cronan | 250/231 SE |
| 4,041,483 | 8/1977 | Groff | 250/231 SE X |
| 4,123,653 | 10/1978 | Bovio | 250/231 SE |
| 4,358,753 | 11/1982 | Cascini | 250/231 SE X |
| 4,384,275 | 5/1983 | Masel et al. | 250/231 SE X |

Primary Examiner—Edward P. Westin
Attorney, Agent, or Firm—George A. Montanye; Gregory G. Williams; H. Fredrick Hamann

[57] ABSTRACT

An encoder system and technique is disclosed for providing greater resolution for position indications. The encoder includes multiple small absolute encoders coupled through a fixed gear ratio to provide an increase in the number of positions which may be absolutely resolved by the encoder without a significant increase in the size of the encoder. The resulting configuration produces a size which is the sum of the individual sizes of the multiple encoders but produces a resolution which is proportional to a multiplication of the individual encoder positions. The resulting encoder provides an absolute indication of position without the requirement for knowledge of the previous position or a predetermined rotation prior to position indication.

15 Claims, 3 Drawing Sheets

ABSOLUTE COMBINATIONAL ENCODERS COUPLED THROUGH A FIXED GEAR RATIO

BACKGROUND OF THE INVENTION

The present invention relates to apparatus and techniques for measuring and indicating position and more particularly to a digital encoder and position indicating technique.

In the prior art, various techniques are known for measuring and indicating the angular position of a shaft during its rotation. Devices of this sort are known as shaft position encoders and generally convert the angular rotation of a disk or drum into a digital code and provide an electrical output signifying the shaft position (different angular positions of the shaft). The electrical outputs representing the code may be produced by patterns on the surface of a drum or disk which are sensed by wipers, magnetic fields, Hall-effect transducers or other electrical apparatus, or by optical structures such as light-emitting diodes and associated photodetectors.

In each configuration, the coded patterns include two discrete areas, one of which represents a high digital value ("1") and the other of which represents a low digital value ("0"). The coded patterns are constructed such that a different pattern is generated at each measured angle of rotation of the shaft and the pattern is detected by an appropriate sensor as the shaft rotates. The coded patterns may be constructed as conducting or insulating areas, reflecting or absorbing areas, transmitting or blocking areas, or magnetic and non-magnetic areas, depending on the particular implementation involved. Naturally, appropriate optical, electrical or magnetic sensors must be used to sense the coded patterns as is appropriate.

In constructing encoders designed to measure the angular position of a rotating shaft, two types of encoders are generally used, namely, absolute and incremental. An absolute encoder includes a structure which provides a unique digital word representing each position of the shaft to be provided during its rotation. This requires a significant increase in the number of coded areas and the number of sensors needed as the resolution of the encoder is increased. As a result, construction of such an encoder requires an increase in its physical size as more patterns are used, thereby limiting the ultimate resolution capability of the device. In addition, the increase in the number of sensors required to provide the resolution makes the construction of such encoders very expensive and in many cases impractical. The use of absolute encoders to provide high resolution has therefore been discouraged in applications requiring small and low cost devices.

As an alternative to the absolute encoder, incremental encoders have also been used to indicate shaft position. Such encoders operate to produce a signal indicative of a transition from one shaft position to another shaft position during rotation of the shaft. In contrast to the absolute encoders, the incremental encoders do not make a determination of absolute shaft position. Rather, they measure shaft rotation from an arbitrary starting position. Typically, the number of transitions from one shaft position to another are counted and stored so that any shaft position with respect to an arbitrary initial position may be calculated.

In one prior art technique disclosed in U.S. Pat. No. 4,041,483, assigned to the same assignee as this application, a hybrid encoder is disclosed which provides an indication of absolute shaft position using an incremental encoding process. The technique employs dual disks having concentric rings formed on each disk. The outer ring on each disk includes an equal number of reflecting and non-reflecting areas, while the inner ring of each disk includes only one small reflecting area. The disks are coupled for rotation with respect to one another by a predetermined ratio and signal outputs are developed during transition from a reflecting to non-reflecting area. These signals are used to drive counters which are proportional to shaft position.

In the above disclosed technique, absolute position of the shaft may be determined but the shaft must be rotated to provide a number of transition signal outputs before that absolute position can be identified. Thus, although the encoder is constructed so that absolute positioning data may be calculated at numerous discrete locations, the configuration still requires some knowledge of the previous location to determine current location, or some minimum amount of motion before the encoder becomes functional. The encoder also requires additional circuitry for counting the transition states between shaft positions as the encoder is rotated, thereby leading to error in the output if any transition states are missed. As in conventional incremental encoders, the above encoder requires continuous sampling or nearly continuous sampling so that no state changes are missed.

While incremental encoders may be used in many environments, their cost and reliability is unacceptable in many current electronic systems requiring digital shaft position encoding with low cost and small size. There is therefore a continuing need for absolute encoders which provide a digital representation of position regardless of prior motion of the encoder without the need for a recognition of transition or state changes during shaft rotation. The invention has therefore been developed to overcome the shortcomings of the above known and similar techniques and to provide a more accurate and higher resolution absolute encoder.

SUMMARY OF THE INVENTION

In accordance with the present invention, an absolute encoder may be formed by combining two or more individual absolute encoders to produce greater resolution related by a multiplication of the individual resolutions, yet with an increase in size by only the sum of the individual encoder sizes. The encoder is constructed by coupling two or more individual encoders by a fixed gear ratio where the gear ratio may be chosen to significantly simplify the mechanical design and packaging of the encoder. In a preferred embodiment, the most useful gear ratios are those which approach 1:1 and 2:1. In this particular embodiment, the positions represented by each encoder corresponds to the number of teeth on the gear driving that particular encoder. The resolution, as represented by the total number of positions which may be achieved by the combined encoders, is calculated by multiplying the number of positions represented by each encoder. Each position is unique and does not rely on previous knowledge of any other sensed position or require any rotation in order to provide an output representative of the angular position of a shaft.

It is therefore a feature of the invention to provide a simple and inexpensive absolute encoder.

It is another feature of the invention to provide an absolute encoder formed by a combination of encoders which has a reouceo size and greater resolution than an equivalent prior art absolute encoder.

Another feature of the invention is to provide an absolute encoder which promotes easy packaging, simplified operation, and reduced weight.

Still another feature of the invention is to provide an absolute encoder which is formed from a combination of individual absolute encoders coupled by a fixed gear ratio to produce an encoder having a resolution proportional to a multiplication of the individual encoder resolutions.

A still further feature of the invention is to provide an absolute encoder which provides improved resolution without reliance upon movement, sampling, or knowledge of the encoder from a prior position.

Yet another feature of the invention is to provide a multiple drum absolute encoder which may be easily assembled for increased resolution.

These and other advantages and novel features of the invention will become apparent from the following detailed description when considered with the accompanying drawings wherein:

BRIEF DESCRIPTION OF THE DRAWINGS

FIG. 3b is a schematic cross-sectional end view of the implementation of FIG. 3a.

FIG. 3c is a top view of a flattened drum surface used as one of the encoding drums in the encoder of FIG. 3a.

DETAILED DESCRIPTION OF A PREFERRED EMBODIMENT

Figure 1:
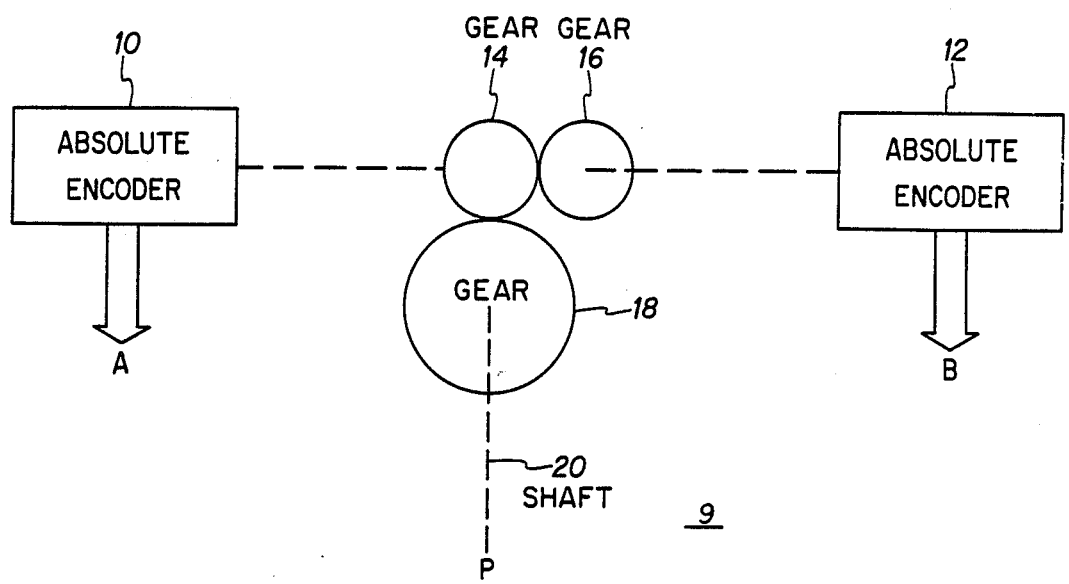
FIG. 1 is a schematic diagram showing an absolute combinational encoder in accordance with the present invention.

Referring first to FIG. 1, there is shown a schematic diagram which broadly depicts the configuration of an absolute combinational encoder 9 in connection with the present invention. The combinational encoder 9 includes a first individual absolute encoder 10 having an output A representing a number of specific positions indicated by that encoder in response to a rotational position of a shaft. The combination encoder 9 also includes a second individual absolute encoder 12 having an output B which represents each of the individual positions indicated by the encoder 12 in response to shaft rotation. The encoders 10 and 12 are coupled to gears 14 and 16, respectively, which are positioned with respect to one another so that gear 14 of absolute encoder 10 meshes with gear 16 of absolute encoder 12. Gears 14 and 16 may then be coupled to be driven by a gear 18 which may in turn be coupled to a rotating shaft 20 for which the angular position is to be indicated.

Normally, the angular position of the shaft 20 is represented as an input position P and that nomenclature will be used throughout the following description. For a short description of the prior art, reference will be made to a portion of FIG. 1 including elements 10, 14, 18 and 20. In the prior art, the shaft 20 would normally be used to rotate the gear 18 and thereafter drive the gear 14 to increment an absolute encoder 10 so that particular angular positions P of the shaft 20 could be resolved and displayed in digital format by the encoder 10 at its output A. By way of example, a typical encoder may include a disk having coded patterned areas over its surface and one or multiple sensors which indicate the position of the disk by sensing the code located at the particular position detected by the sensor. As will be understood, as the input shaft 20 is rotated, for each position P, there is a corresponding output position A represented by the coded patterned areas on the surface of the rotating disk of encoder 10. For low resolution, only a small number of positions need to be coded on the surface of the disk, thereby requiring only a small number of sensors to detect shaft positions.

While the above configuration operates well for low accuracy measurements of shaft position, it can be seen that problems are encountered as greater resolution of shaft position is required. Thus, for multiple turns of shaft 20, an increasing number of coded positions is necessary on the encoding disk of encoder 10 in order to provide an absolute output of shaft position P from output A. As the resolution increases and the number of positions follows that increase, a larger disk is required in encoder 10 to produce unique values representing the many positions P of the input shaft 20. Along with the increase in size, there is also an increase in the number of sensors and related circuitry needed to decode position thereby leading to a significant increase in the cost, complexity and weight of such high resolution absolute encoders. Although the absolute encoders provide a simple output which can be easily converted to an indication of position, the above drawbacks have limited its application in many new electronic systems.

In accordance with the present invention, by coupling two or more individual absolute encoders 10 and 12 together through gears 14 and 16, which have a fixed gear ratio, and then driving the gears in response to the rotation of a shaft 20, the resolution of the system can be increased to a value proportional to the number of positions sensed by encoder 10 multiplied by the number of positions sensed by encoder 12. In the present example, if the number of positions sensed by encoder 10 is designated as N1 and the number of positions sensed by encoder 12 is designated as N2, then the total number of positions P which can be indicated by the combinational encoder can be expressed as $P = N1 \times N2$.

In implementing the absolute combinational encoder in accordance with the above teachings, several relationships must be observed to produce a functional encoder. In the case of two encoders forming the combinational encoder, if we define $N1 = M \times K$, then N2 must equal $(N1/M) - 1$ where N1, N2, M and K are integers. While the choice of gear ratios does not have any effect on the resolving capability of the combinational encoder, it does effect the relative coding scheme between the two original encoders as well as the construction and configuration of the mechanical assembly. Under the above constraints, it has been found that the most preferable gear ratio is that of N1:N2 which allows relative gear ratios of nearly 1:1 and 2:1 when M has values of one and two, respectively. In this particular configuration, the gearing is simplified and easily implemented in connection with the multiple position encoders 10 and 12.

Figure 2:
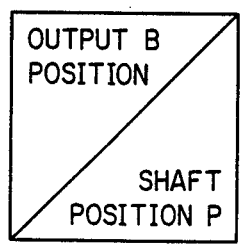
FIG. 2 is a table showing one example of individual encoder positions and their relation to shaft position for providing a coded position output.

Referring now to the table of FIG. 2, an example of a simple absolute combinational encoder constructed in accordance with the above requirements is shown. In the example of FIG. 2, the value for M is chosen as one and the value for K is chosen as 8, thereby leading to a value of N1=1×8=8. The gear ratio is then set at N1:N2 where N2=(N1/M)−1=(8/1)−1=7. The absolute encoder 10 is thus an eight position encoder which may be driven by a gear 14 having eight teeth and the absolute encoder 12 is a seven position encoder which may be driven by a gear 16 having seven teeth. The number of shaft positions that may be defined by this encoder is then P=N1×N2=8×7=56. The absolute combinational encoder 9 may thus provide 56 uniquely encoded positions using only a simple mechanical combination of the two eight and seven-position encoders 10 and 12.

Each of the above 56 positions can be uniquely identified as will be apparent by reference to the table of FIG. 2. As shown in the table, the headings of the vertical columns labeled 1 through 8 represent the positions of absolute encoder 10 as would be provided by the output A of that encoder. Each of the diagonally divided blocks in the horizontal rows represent (a) individual positions of the absolute encoder 12 as provided by the output B (upper diagonal section) and (b) the position P (lower diagonal section) of the input shaft 20. Positioned along the left-hand side of the table is an additional indication of the number of turns made by the absolute encoder 10 as it relates to defining each of the input shaft positions P.

Recognizing in the present example that the gear 14 has the same number of teeth as the number of positions indicated during one rotation of absolute encoder 10, and that the gear 16 has the same number of teeth as the number of positions represented by one rotation of the absolute encoder 12, it can easily be seen that each increment produced by the rotation of the input shaft 20 may rotate gear 14 to move encoder 10 one position and produce a correponding movement through gear 16 to move encoder 12 through one position. During the first seven position changes 20 of the encoder 10, the encoder 12 moves the same number of corresponding positions as evidenced by the A position numbers corresponding to the B position numbers in the upper diagonal sections in the first horizontal row. As the absolute encoder 10 increments to the eighth position, the absolute encoder 12 returns to its first position due to its one less position and corresponding coupling through gear 16 with one less tooth. The input position P corresponding to the last position of encoder 10 is therefore uniquely defined by the eighth position of encoder 10 at output A and the first position of encoder 12 at output B. Likewise, after one complete revolution of the encoder 10, that angular position P of the input shaft 20 is uniquely represented by the first position of encoder 10 at output A and the second position of encoder 12 at output B. It should be particularly noted, that although the present example has been defined with gears differing by only one tooth, the exact number of teeth on each gear is not critical so long as the gear ratio remains fixed to achieve the defined operation. Thus, for example, the above embodiment could also be implemented with gears 14 and 16 having 16 and 14 teeth, respectively, or any other multiple fixing the 8:7 gear ratio.

As the input shaft 20 continues to rotate each of the encoders 10 and 12 through the fixed gear coupling, each of the successive positions P of the shaft 20 is represented by a unique combination of outputs A and B from encoders 10 and 12. Only after the encoder 10 has rotated seven complete revolutions does the combination of outputs from A and B return to that same combination as encountered at the start. Thus, after 56 unique shaft positions P have been defined by the combination of outputs A and B, the encoder will repeat the same combination of outputs A and B and therefore be unable to distinguish from prior shaft positions. The resolution of the exemplary encoder having N1=8 and N2=7 is therefore limited to the 56 discrete positions defined by the combination of A and B outputs from the encoders 10 and 12.

By referring to the table of FIG. 2, it can thus be seen that the shaft position P as represented in the lower diagonal section of each horizontal row can be easily defined by decoding the combination of outputs A and B. By way of example, the thirtieth increment of the input shaft 20 (which occurs in the fourth rotation of the encoder 10 at the sixth position of encoder 10 and the second position of encoder 12), may easily be encoded with the knowledge that the sixth position of encoder A and second position of encoder B only occur at that thirtieth increment. In a like manner, all other incremental positions from one to 56 may be decoded by knowing the position of encoder 10 and position of encoder 12 to produce an absolute output of position P.

In order to implement the above combinational encoder, a variety of configurations may be employed. For example, individual disks having a predetermined number of positions each defined by a binary pattern on the face of each disk could be driven by gears having the above described ratio. Each of the gears for encoder 10 and 12 could be coupled to drive one another in the manner indicated and coupled to an input shaft 20 for rotation as described. A series of sensors located adjacent each disk could then be used to sense the position and provide a readout of each of the individual positions from encoder 10 and encoder 12. The outputs A and B from encoder 10 and encoder 12 could then be coupled to a processor or other conventional logic decoding circuitry designed to provide an indication of position P upon the receipt of the two unique signals from encoder 10 and encoder 12.

Figure 3B:
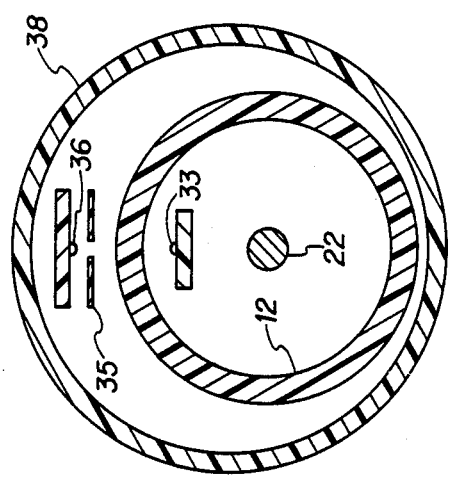
Figure 3A:
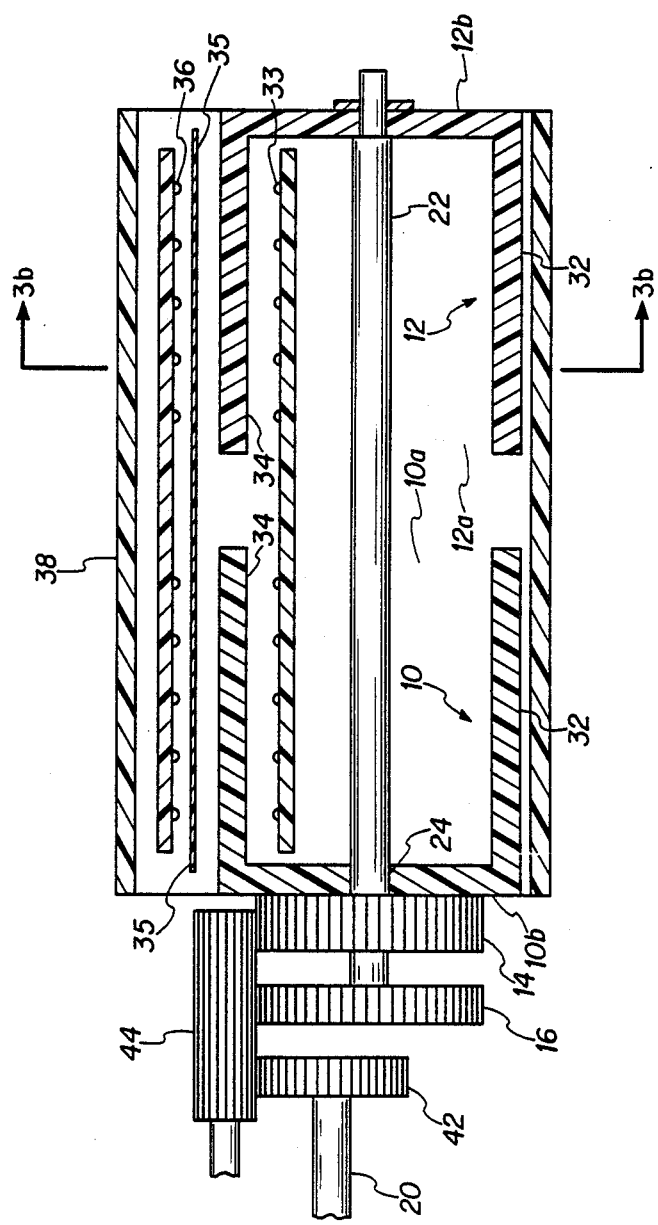
FIG. 3a is a schematic side-sectional view of one implementation of an absolute combinational encoder.

Although other implementations could be employed, a preferred embodiment is that of a multiple drum construction schematically shown in FIG. 3. The drum construction allows a more compact and simplified structure to be employed, thereby reducing the size, weight, and complexity of the final combinational encoder. In the example shown in FIG. 3a, each of the encoders 10 and 12 are illustrated as individual drums 10 and 12. The drum 12 may be a portion of a cylinder having an open end 12a and an end plate 12b mounted to a shaft 22 to enable rotation of the cylindrical portion 12 about an axis defined by shaft 22. Shaft 22 has a circular gear 16 fixed to one end to enable rotation of the shaft 22 and drum 12 as will be subsequently described. Using the example of the 56-position encoder described previously, the gear 16 would include seven teeth equally spaced about its periphery and rotate simultaneously with shaft 22 and drum 12.

In a similar manner, drum 10 may be a portion of a cylinder having an open end 10a and an end-plate 10b having an opening 24 rotatably receiving shaft 22 so that drum 10 is coaxial with the axis formed by shaft 22 and allows rotation of drum 10 about that axis independent of the rotation of drum 12. A second gear 14 is mounted coaxial with the drum 10 to the end 10b for rotation with the drum 10. Again, using the example of the above-referenced 56-position encoder, the gear 14 may be formed to have eight teeth equally spaced about its periphery. A cross-sectional end view of the combinational encoder, looking along the shaft 22, from the point defined by the line 3b—3b would generally appear as shown in FIG. 3b.

Figure 3C:
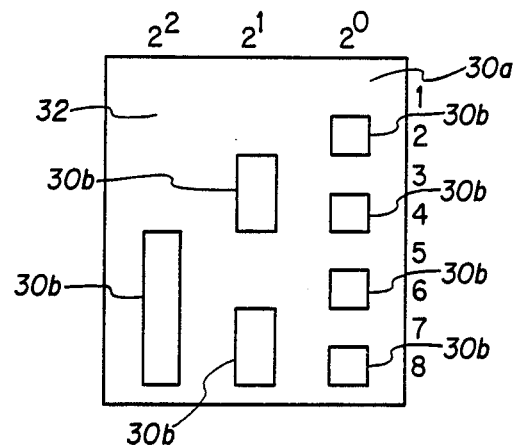

Referring now to FIG. 3c, there is shown the surface 32 of a drum as it would appear if it were unrolled to form a flat surface. In this example, each position is defined by a series of binary patterns representing ones and zeroes across the width of the strip ($2^0$, $2^1$, and $2^2$ representing the respective binary positions). The actual position is indicated schematically for reference by the numbers 1 through 8 along the length of the strip in FIG. 3c. In the present example, the zeros (low digital value) may be represented by a non-transmitting portion 30a of the drum surface 32 and the ones (high digital value) represented by an aperture 30b in the drum surface 32 which allows light transmission through the drum surface 32. The example of FIG. 3c shows only the surface of drum 10 having eight positions defined over one rotation of the drum surface, it being apparent that the drum 12 would be similarly configured to have seven positions defined by the pattern over one rotation of its surface. The patterns are formed to correspond to each of the positions defined by the eight and seven tooth gears 14 and 16, respectively.

To enable sensing of the individual positions of each of the drums 10 and 12, a series of mounted light-emitting diodes 33 may be linearly arranged along the inner surface 34 of the drums 10 and 12, respectively, so that the diodes are parallel to the shaft 22 and positioned adjacent the inner surface 34 of each of the drums 10 and 12. The diodes may be attached to a base plate for support as schematically shown and the plate held stationary within the structure in any conventional manner. An aperture plate 35 may be positioned in opposed parallel relationship to the linear arrangement of photodiodes 33, but adjacent the outer surface 32 of each of the drums 10 and 12. The aperture plate 35 provides a series of apertures aligned between the diodes 33 and phototransistors 36, each providing a narrow slit for restricting the transmission of light from the photodiodes 33 through the openings 30b and thence to an associated phototransistor on phototransistor board 36 which receives the binary encoded positions defined by the pattern of apertures 30b. The phototransistor board 36 may include a linear series of conventional phototransistors having a number equal to that of the photodiodes 33 and lying in opposed relationship to the photodiodes 33 parallel to shaft 22 and adjacent the aperture plate 35. Again, the plates 35 and 36 are only schematically shown, it being apparent that these could be held in a stationary position within the structure by any conventional fastening technique.

As will be understood with reference to FIG. 3a and 3b, as each drum rotates, the pattern defined at each position along the surface 32 of the drum allows the transmission of light through apertures 30b or prevents the transmission of light through the other binary positions 30a with each position defined by a unique combination of transmitting and non-transmitting areas 30b and 30a. The binary number represented by that pattern is sensed by the phototransistors 36 and may then be coupled to an external microprocessor or other conventional logic decoding device for defining the position of an input shaft as was previously described. The phototransistor board 36, aperture plate 35, and photodiode assemblies 33 may be mounted within a cylindrical casing 38 in any conventional manner to form a conveniently packaged encoder assembly. Coupling terminals or wires may then be attached individually to the phototransistors and photodiodes and coupled externally through the casing 38 to provide the required power for photodiode and phototransistor operation.

Input from a shaft 20 for which the position P is to be sensed may then be provided by numerous means of coupling to the gears 14 and 16. In the example shown in FIG. 3a, an input shaft 20 has a gear 42 located at one end thereof. The gear 42 is then coupled to an idler gear 44 (schematically shown) which rotates in response to rotation of the input shaft 20 and is coupled to both the gear 14 and gear 16. Thus, as the input shaft 20 rotates and in turn rotates gear 42, the idler gear 44 moves gears 14 and 16 each through one position. Since the gear teeth are coordinated with the patterns on the surface of the drums so that each tooth position represents one position of the encoders 10 and 12, movement of the idler gear will rotate drum 10 and drum 12 through one position each in synchronism with one another. In this manner, the series of positions as defined by the table in FIG. 2 will be generated and enable the position of input shaft 20 to be accurately defined. Naturally, as the number of positions defined by the patterns on the surface 32 of the drum illustrated in FIG. 3c, is increased, so will be the resolution of the encoder.

In the above description, in order for the encoders to provide error-free operation, the drums 10 and 12 must be detented (in any conventional manner) so that the position changes for each drum 10 and 12 occur simultaneously. If certain constraints are followed, however, the need for detents may be avoided in construction of the above encoders. More particularly, if N1 and N2 each have common factors, e.g., N1=K(N1') and N2=K(N2') where N1' and N2' are acceptable numbers established in accordance with the previous constraints, then an encoder may be constructed with 2K(N1'×N2') positions without the need for a detent. Specifically, this may be accomplished by positioning one encoder one-half position displaced with respect to the position of the other encoder. When this configuration is constructed, the shift ensures that the two encoders never change state at the same time, thereby always producing an ambiguity only at one of the borderline conditions where the potential error is limited solely to each adjacent position and not some position a whole turn or more away. This situation essentially reduces the ambiguity so that no actual error in output will occur. When the encoder is constructed in this manner, the structure is defined as a non-detenting encoder and is characterized by the lack of a requirement that the two encoders change positions at the same time.

Figure 4:
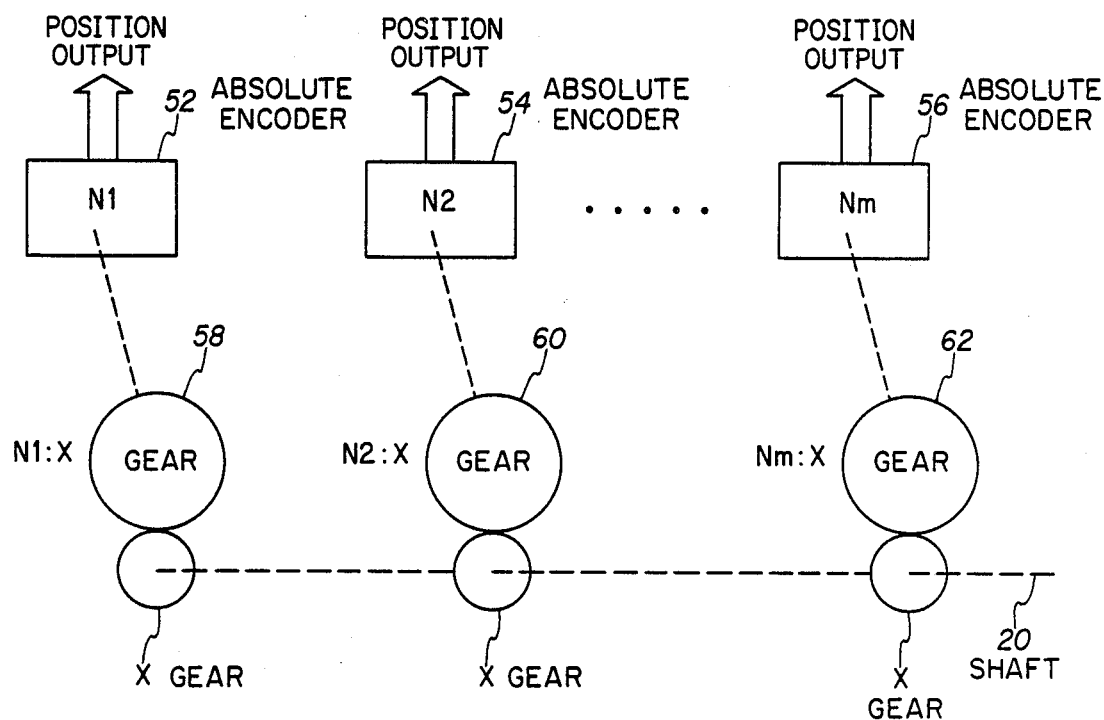
FIG. 4 is a schematic diagram showing a multistage encoder in accordance with the inventive technique.

While the above combinational encoder has been described with respect to only two absolute encoders, the construction of other combinational encoders with more than two absolute encoders is also obtainable. For example, the configuration could be that as schematically shown in FIG. 4. In this instance, a simple m-stage encoder has absolute encoders 52, 54, . . . 56 having positions N1, N2, . . . Nm, respectively and being driven by gears 58, 60, . . . 62, respectively. Idler gear X may then drive each of the gears 58, 60, . . . 62 and itself be driven by shaft 20. The gear ratios are shown as N1:X, N2:X, . . . Nm:X. For a detented encoder, the number of unique positions that could be defined would be equal to the product of the individual positions and thus N1×N2×. . . Nm. For a non-detented encoder, the number of positions which are obtainable is related by a different formula consistent with the constraints imposed. Thus, in a multistage encoder wherein the number of stages is designated by the number m and the positions on each stage designated as Nx and each $Nx = Nx'K$ where x is a positive integer $\geq 1$ and K is the common factor needed to produce the non-detenting situation, the number of unique positions obtainable is equal to $Km(N1' \times N2' \times N3' \ldots Nm')$. In all cases the gear ratios would be maintained in accordance with that previously described.

Although the multistage encoder is simply shown as a combination of individual absolute encoders in FIG. 4, it will be apparent that other configurations may be employed. If each combination of two encoders (as set forth in FIG. 1) is itself considered a single encoder, for example, it may then be combined with another set of two encoders treated as an individual encoder. The gear ratios may then be determined by treating each combination as an individual encoder and following the previously-mentioned teachings. In this manner, any number of combinations of individual encoders can be combined and the necessary gearing determined using the same rules as applied to the example of FIG. 1.

While the above structure has been shown with reference to an optical device, it is apparent that other configurations could be employed for defining and sensing the patterns representing the position on the surfaces 32 of the drums. Thus, the electrical, mechanical and magnetic implementations previously utilized in the prior art, could also be employed to provide the pattern sensing in the exemplary embodiment. Also, while the number of positions defined by the drum surfaces is only limited by those constraints previously mentioned, it is generally more efficient in terms of size, cost and parts count if the value for N1 is a power of two, and the value for M is chosen as one or two. When this relationship is maintained, N2 will be very close to a power of two, which will maximize the volumetric efficiency of the encoder. As was previously mentioned, when the gear ratio is fixed at N1:N2, the number of combinations which may be employed to produce encoder outputs is very large. It is not necessary that $N2 = (N1/M) - 1$ in this instance, the only restriction being that N1 and N2 are not factors of each other. If J is the largest common factor of N1 and N2, the number of uniquely encoded positions that may be obtained is $(N1 \times N2)/J$ for a detented encoder and $2(N1 \times N2)/J$ for a non-detented encoder.

As can be seen by the above description, the present invention provides an absolute combinational encoder which is capable of providing higher resolution with a reduction in the size, weight, and complexity of the encoding structure. The assembly combines several absolute encoders in a manner which makes the resolution proportional to a product of the number of positions resolved by the individual encoders, yet only requires a configuration equal to the sum of the individual encoders. The absolute combinational encoder may be easily constructed using readily available components, thereby making the structure simple and inexpensive. Various configurations may be employed to produce the same benefits of increased resolution, yet allowing different configurations to be used in environments as required. The encoder provides a definition of shaft position absolutely without requiring any specific knowledge of previous shaft position or any rotation of the encoder by any amount before shaft position is defined. This allows simpler decoding of the encoder outputs, thereby reducing the number of peripheral devices required for position calculation and display. The size, weight, and configuration allows use in a variety of applications including motor drive circuits and any other devices from which position may be defined by shaft rotation. These are all features that are not suggested or taught in the prior art.

Obviously, many other modifications and variations of the present invention are possible in light of the above teachings. It is therefore to be understood that within the scope of the appended claims, the invention may be practiced otherwise than as specifically described.

What is claimed is:

1. An encoder having improved resolution comprising:
    first means for providing a predetermined number of output position indications, said first means comprising a first absolute encoder having a first predetermined number of output positions N1, where $N1 = K(M)$ and K and M are integer $\geq 1$, where M is a selected one of the integers 1 and 2;
    at least one second means for providing a different predetermined number of output position indications, said second means comprising a second absolute encoder having a second predetermined number of output positions N2 where $N2 = (N1/M) - 1$; and
    means for coupling said first and second means to one another for providing a predetermined number of combined output position indications proportional to the product of the number of output position indications of said first and second means, said means for coupling including a first gear coupled to drive said first absolute encoder and a second gear coupled to said first gear and coupled to drive said second absolute encoder, said first and second gears having a gear ratio selected to be N1:N2.

2. The apparatus of claim 1 wherein said first gear has a number of teeth equal to N1 and said second gear has a number of teeth equal to N2.

3. The apparatus of claim 1 wherein said first and second means are each disks having predetermined coded patterns on a surface thereof representing said predetermined number of positions.

4. The apparatus of claim 1 wherein said at least one second means is a plurality of second means, each providing a predetermined number of output position indications.

5. The apparatus of claim 1 wherein each of said predetermined number of position indications in said first and second means is represented by a coded pattern and further including means for sensing each of the coded patterns of said first and second means.

6. The apparatus of claim 5 wherein said first means includes a first drum having a predetermined number of optical patterns over its surface, each pattern representing an absolute output position; and said second means includes a second drum having a predetermined number of optical patterns over its surface, each corresponding to an absolute output position.

7. The apparatus of claim 6 further including:
    means for detecting each of the optical patterns associated with said first means and providing an output thereof; and means for detecting each of the optical patterns associated with said second means and providing an output thereof;

means for combining the outputs of said detecting means for providing said predetermined number of combined output position indications.

8. A shaft position encoder comprising:

first means for providing a predetermined first number of absolute output positions N1 in response to movement thereof, where $N1 = K(M)$ and K and M are integers $\geq 1$;

second means for providing a predetermined second number of absolute output positions N2 in response to movement thereof, where $N2 = (N1/M) - 1$;

means for coupling said first and second means to one another to provide a predetermined number of absolute positions formed by a combination of the output positions from said first and second means which is proportional to the product of the number of absolute output positions of said first and second means, said means for coupling including first and second gear couple to said first and second means, respectively, and having a gear ratio fixed at N1:N2; and means responsive to a shaft for moving at least one of said first and second means to produce said combination of output positions representing shaft position.

9. The apparatus of claim 8 wherein said first gear has a number of teeth equal to N1, said second gear has a number of teeth equal to N2, said first and second gears are coupled to one another, and a third gear is coupled to a shaft and to one of said first and second gears for rotation thereof.

10. The apparatus of claim 8 wherein said means for coupling further includes an idler gear coupled to each of said first and second gears and said means responsive to a shaft comprises a gear coupled for rotation with a shaft and coupled to drive said idler gear.

11. The apparatus of claim 10 wherein said combinations of outputs each represent a unique position of said shaft.

12. The apparatus of claim 8 wherein said first means is an absolute encoder having a coded pattern representing each of said predetermined positions and said second means is an absolute encoder having a coded pattern representing each of said predetermined positions and said means for coupling comprises a first gear coupled to move the absolute encoder of said first means and a second gear coupled to move said absolute encoder of said second means.

13. The apparatus of claim 12 wherein said absolute encoders are drum encoders.

14. A shaft position encoder comprising:

first means for providing a predetermined first number of absolute output positions N1 in response to movement thereof, where $N1 = K(M)$ and K and M are integers $> 1$;

second means for providing a predetermiend second number of absolute output positions N2 in response to movement thereof, where $N2 = (N1/M) - 1$;

means for coupling said first and second means to one another to provide a predetermined number of absolute positions formed by a combination of the output positions from said first and second means which is proportional to the product of the number of absolute output positions of said first and second means, said means for coupling including first and second gears coupled to said first and second means, respectively, said first gear having a number of teeth equal to N1 and said second gear having a number of teeth equal to N2, said gears having a gear ratio fixed at N1:N2; and means responsive to a shaft for moving at least one of said first and second means to produce said combination of output positions representing shaft positions.

15. In a shaft position encoder having a rotating shaft coupled to an absolute encoder such that for each increment of shaft rotation by a predetermined amount the encoder provides a unique output representing shaft position for that increment, the improvement in the absolute encoder comprising:

a first absolute encoder providing a first predetermined number of position outputs N1 where $N1 = K(M)$ and K and M are integers $\geq 1$ and M is a selected one of the integers 1 and 2;

a second absolute encoder providing a second predetermined number of position outputs N2 different from said first encoder, wherein $N2 = (N1/M) - 1$; and means for coupling said first absolute encoder to said second absolute encoder to form an absolute combinational encoder for producing a plurality of unique outputs representing shaft positions, each formed by a combination of one position output from each encoder, and proportional to the product of the number of position outputs of said first and second absolute absolute encoders, said means for coupling a first gear coupled to drive said first encoder and a second gear coupled to said first gear and coupled to drive said second encoder, said first gear having a number of teeth equal to N1 and said second gear having a number of teeth equal to N2, and said first and second gear having a fixed gear ratio N1:N2.

* * * * *